(12) United States Patent  
Hwang et al.

(10) Patent No.: US 9,060,452 B2  
(45) Date of Patent: Jun. 16, 2015

(54) METHOD FOR MANUFACTURING INSULATED CONDUCTIVE PATTERN AND LAMINATE

(75) Inventors: Ji-Young Hwang, Daejeon (KR); Sung-Joon Min, Daejeon (KR); In-Seok Hwang, Daejeon (KR); Dong-Wook Lee, Daejeon (KR); Sang-Ki Chun, Daejeon (KR)

(73) Assignee: LG CHEM, LTD., Seoul (KR)

( * ) Notice: Subject to any disclaimer, the term of this patent is extended or adjusted under 35 U.S.C. 154(b) by 147 days.

(21) Appl. No.: 13/147,995

(22) PCT Filed: Feb. 8, 2010

(86) PCT No.: PCT/KR2010/000765
§ 371 (c)(1),
(2), (4) Date: Aug. 4, 2011

(87) PCT Pub. No.: WO2010/090489
PCT Pub. Date: Aug. 12, 2010

(65) Prior Publication Data
US 2011/0290548 A1  Dec. 1, 2011

(30) Foreign Application Priority Data

Feb. 6, 2009 (KR) .................. 10-2009-0009750
Dec. 21, 2009 (KR) .................. 10-2009-0127756
Dec. 21, 2009 (KR) .................. 10-2009-0127757
Dec. 21, 2009 (KR) .................. 10-2009-0127759

(51) Int. Cl.
*H05K 3/02* (2006.01)
*H05K 3/28* (2006.01)
*H05K 3/06* (2006.01)

(52) U.S. Cl.
CPC .................. *H05K 3/28* (2013.01); *H05K 3/061* (2013.01); *H05K 3/064* (2013.01); *H05K 2201/09827* (2013.01); *H05K 2203/0571* (2013.01); *H05K 2203/1184* (2013.01)

(58) Field of Classification Search
CPC .............. H05K 2203/0574; H05K 2203/1184; Y10T 29/49128; Y10T 29/49158
USPC ........ 29/847, 825, 829, 846, 853; 216/13, 41; 349/43, 46, 49, 51
See application file for complete search history.

(56) References Cited

U.S. PATENT DOCUMENTS 6,204,520 B1   3/2001   Ha et al.
6,377,138 B1   4/2002   Takagi et al.
(Continued)

FOREIGN PATENT DOCUMENTS

CN          1236505 A       11/1999
CN          1381860 A       11/2002
(Continued)

OTHER PUBLICATIONS

Office Action of Chinese Patent Office Application No. 201080007007.6, dated Apr. 24, 2013.
(Continued)

*Primary Examiner* — Thiem Phan
(74) *Attorney, Agent, or Firm* — McKenna Long & Aldridge LLP

(57) ABSTRACT

The present invention provides: a method for manufacturing an insulated conductive pattern, wherein a conductive film and an insulation layer pattern are formed on a substrate, and the insulation layer pattern is reformed to cover a conductive pattern after formation of the conductive pattern by etching the conductive film using the insulation layer pattern as a mask; and a laminate manufactured thereby. According to the present invention, the number of processes is sharply reduced in comparison with the existing processes, and economic efficiency can be greatly improved.

11 Claims, 10 Drawing Sheets

(56) References Cited

U.S. PATENT DOCUMENTS

| | | | |
|---|---|---|---|
| 6,541,389 B1 | 4/2003 | Kubo et al. | |
| 6,933,989 B2 * | 8/2005 | Oke et al. | 349/43 |
| 7,396,765 B2 | 7/2008 | Lee et al. | |
| 7,932,183 B2 * | 4/2011 | Itoh et al. | 438/717 |
| 2001/0007362 A1 | 7/2001 | Ha et al. | |
| 2003/0017422 A1 | 1/2003 | Yamaguchi | |
| 2003/0026959 A1 | 2/2003 | Furuse et al. | |
| 2003/0052078 A1 | 3/2003 | Sakayori et al. | |
| 2003/0232574 A1 | 12/2003 | Abrahamians et al. | |
| 2004/0229028 A1 | 11/2004 | Sasaki et al. | |
| 2005/0158639 A1 | 7/2005 | Yamaguchi | |
| 2006/0256095 A1 | 11/2006 | Bottari et al. | |
| 2007/0031140 A1 | 2/2007 | Biernath et al. | |
| 2007/0097278 A1 | 5/2007 | Rho et al. | |
| 2008/0110858 A1 | 5/2008 | Itoh et al. | |
| 2009/0029127 A1 | 1/2009 | Watanabe et al. | |
| 2010/0053759 A1 | 3/2010 | Inoue et al. | |
| 2010/0206628 A1 | 8/2010 | Matsui et al. | |
| 2010/0244666 A1 | 9/2010 | Tanaka | |

FOREIGN PATENT DOCUMENTS

| | | |
|---|---|---|
| CN | 1622699 A | 6/2005 |
| CN | 1975517 A | 6/2007 |
| CN | 101034262 A | 9/2007 |
| CN | 101189930 A | 5/2008 |
| EP | 0 127 794 A2 | 12/1984 |
| EP | 0127794 A2 | 12/1984 |
| EP | 2059095 A1 | 5/2009 |
| JP | 1976-097770 A | 8/1976 |
| JP | 1980-6833 A | 1/1980 |
| JP | 60191750 A | 9/1985 |
| JP | 01170556 U | 1/1989 |
| JP | 64045566 A | 2/1989 |
| JP | 1993-054326 A | 3/1993 |
| JP | 06-204536 A | 7/1994 |
| JP | 06333891 A | 12/1994 |
| JP | 1998-200234 A | 7/1998 |
| JP | 2000-188277 | 7/2000 |
| JP | 2000315683 A | 11/2000 |
| JP | 2000315890 A | 11/2000 |
| JP | 2001-077098 | 3/2001 |
| JP | 2003-069188 A | 3/2003 |
| JP | 2006116675 A | 7/2004 |
| JP | 2004-221564 A | 8/2004 |
| JP | 2006344163 A | 12/2006 |
| JP | 2008009921 A | 1/2008 |
| JP | 2008-084837 | 4/2008 |
| JP | 2008-84837 A | 4/2008 |
| JP | 2008083497 A | 4/2008 |
| JP | 2008-147613 | 6/2008 |
| JP | 2008134975 A | 6/2008 |
| JP | 2008-251822 A | 10/2008 |
| JP | 2009009249 A | 1/2009 |
| JP | 2009-176198 A | 8/2009 |
| JP | 2010-079240 A | 4/2010 |
| KR | 10-0442556 B1 | 1/2003 |
| KR | 100442556 B1 | 7/2004 |
| KR | 10-2006-0060795 A | 6/2006 |
| KR | 10-2006-0070333 A | 6/2006 |
| KR | 10-0663291 B1 | 12/2006 |
| KR | 2008-0042111 A | 5/2008 |
| TW | 493285 B | 7/2002 |
| TW | 200818981 A | 4/2008 |
| WO | 2008/029776 A1 | 3/2008 |
| WO | 2008-029776 A1 | 3/2008 |

OTHER PUBLICATIONS

Office Action of Japanese Patent Office in Application No. 2012-520547, dated Apr. 2, 2013.

Printed Circuits Handbook, Sixth Edition, Clyde F. Coombs, Jr, 2008, McGraw-Hill, ISBM: 978-0-07-146734-6, p. 34.22-34.25.

Office Action of Japanese Patent Office in Application No. 2012-520547, dated Mar. 17, 2014.

Office Action of Chinese Patent Office in Application No. 201080007009.5, dated Feb. 25, 2014.

* cited by examiner

[CASE WHERE INSULATION LAYER PATTERN REFORMING PROCESS IS NOT USED]

[CASE WHERE INSULATION LAYER PATTERN REFORMING PROCESS IS USED]

EXAMPLE 1

EXAMPLE 10

EXAMPLE 11

METHOD FOR MANUFACTURING INSULATED CONDUCTIVE PATTERN AND LAMINATE

This application is a national stage application of PCT/KR2010/000765, filed Feb. 8, 2010, which claims priority from Korean Patent Application Nos. 10-2009-0009750, 10-2009-0127756, 10-2009-0127757 and 10-2009-0127759, filed on Feb. 6, 2009, Dec. 21, 2009, Dec. 21, 2009 and Dec. 21, 2009 in the KIPO, respectively, all of which are incorporated herein by reference in their entirety.

DISCLOSURE

1. Technical Field

The present invention relates to a method for manufacturing an insulated conductive pattern and laminate.

2. Background Art

A process for manufacturing a known general conductive pattern is as follows. First, a photoresist pattern is formed by uniformly coating photoresist on a conductive film formed on a substrate and selectively exposing and developing the photoresist. Subsequently, the conductive pattern is transferred on a lower layer of the photoresist by etching the conductive film by using the patterned photoresist pattern as a mask. Thereafter, the unnecessary photoresist layer is removed by a stripping solution. Subsequently, an insulation layer is uniformly coated on an entire surface of the substrate on which the conductive pattern is formed.

The known process does not use a constitutional element of the conductive pattern but uses a photoresist material and a stripping solution, thereby increasing a process cost due to a cost of the photoresist material and the stripping solution and a cost of removal the photoresist material and the stripping solution. In addition, there is a problem in that an environment is polluted by removal of the above materials. In addition, since the known process has the large number of processes and is complicated, much time and many costs are required, and in the case where the photoresist material is not sufficiently stripped, there is a problem in that defects occur in the final products.

In order to solve the problems, efforts such as maintenance of foreign materials in the process, development of reuse methods of the stripping solution, development of environmentally friendly technologies, or development of an effective stripping solution have been continuously made, but a more basic solving method is required.

DISCLOSURE

Technical Problem

The present invention has been made in an effort to provide a method for manufacturing insulated conductive pattern, in which the number of processes is small as compared to a known process and economic efficiency is largely improved and a laminate including the insulated conductive pattern manufactured by using the same.

Technical Solution

In order to achieve the objects, an exemplary embodiment of the present invention provides a method for manufacturing an insulated conductive pattern, including: a) forming a conductive film on a substrate; b) forming an insulation layer pattern on the conductive film; c) forming a conductive pattern by etching the conductive film by using the insulation layer pattern as a mask; and d) reforming the insulation layer pattern for covering the conductive pattern.

Another exemplary embodiment of the present invention provides a laminate including a substrate, a conductive pattern formed on the substrate, and an insulation layer pattern covering the conductive pattern, and is manufactured by using the method for manufacturing the insulated conductive pattern.

Yet another exemplary embodiment of the present invention provides a laminate including a substrate, a conductive pattern formed on the substrate, and an insulation layer pattern covering the conductive pattern, wherein a taper angle of the conductive pattern is small. The taper angle of the conductive pattern may be more than 0 to less than 90°, preferably more than 0 to 45° or less, and more preferably more than 0 to 30° or less.

Still yet another exemplary embodiment of the present invention provides a laminate including a substrate, a conductive pattern formed on the substrate, and an insulation layer pattern covering the conductive pattern, wherein a taper angle of the insulation layer pattern is small. The taper angle of the insulation layer pattern may be more than 0 to less than 90°, preferably more than 0 to 70° or less, and more preferably more than 0 to 30° or less.

Still yet another exemplary embodiment of the present invention provides a laminate including a substrate, a conductive pattern formed on the substrate, and an insulation layer pattern covering the conductive pattern, wherein a taper angle of the insulation layer pattern is larger than the taper angle of the conductive pattern. The taper angle of the insulation layer pattern is not particularly limited if the taper angle of the insulation layer pattern is larger than the taper angle of the conductive pattern, but the taper angle of the insulation layer pattern more preferably is more than 0 to 45° or less.

Still yet another exemplary embodiment of the present invention provides a laminate including a substrate, a conductive pattern formed on the substrate, and an insulation layer pattern covering the conductive pattern, wherein a void is included between the conductive pattern and the insulation layer pattern.

Still yet another exemplary embodiment of the present invention provides a laminate including a substrate, a conductive pattern formed on the substrate, an insulation layer pattern covering the conductive pattern, wherein in a cross-section of a line width direction of the conductive pattern, a percentage ratio (a/b*100) of a distance a from one side end of the conductive pattern to the insulation layer pattern and a distance b from the other side end of the conductive pattern to the insulation layer pattern is in the range of 90 to 110.

Advantageous Effects

According to the exemplary embodiments of the present invention, since a separate photoresist material and a stripping solution for forming a conductive pattern are not used, there are no problems of an increase in cost and an environmental pollution, and since a process is simple as compared to a known photolithography process, there is an economic efficiency. In addition, since the mask pattern used when the conductive pattern is formed is not removed, and the pattern is used when the conductive pattern is insulated by reforming the pattern, the conductive pattern that is not insulated by the insulation pattern does not remain, such that foreign materials such as conductive materials do not remain on a substrate, thus preventing the occurrence of short-circuit.

BEST MODE

Hereinafter, the present invention will be described in more detail.

Figure 10:
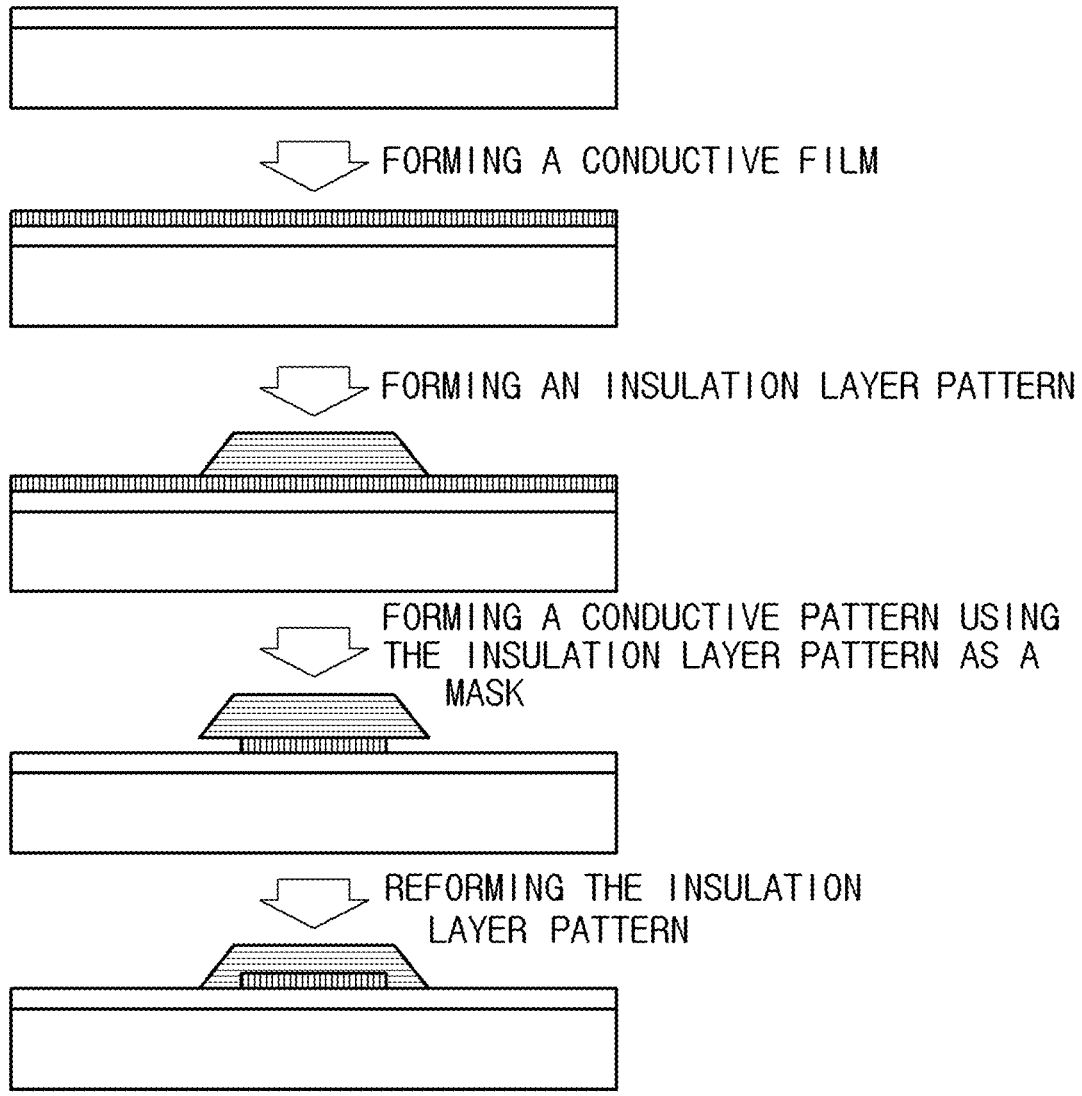
FIG. 10 is a mimetic diagram illustrating a method according to an exemplary embodiment of the present invention in views of a lateral surface of a laminate.

An exemplary embodiment of the present invention relates to a method for manufacturing an insulated conductive pattern, including:

a) forming a conductive film on a substrate;

b) forming an insulation layer pattern on the conductive film;

c) forming a conductive pattern by etching the conductive film by using the insulation layer pattern as a mask; and d) reforming the insulation layer pattern for covering the conductive pattern. An example of the method for manufacturing the insulated conductive pattern according to the exemplary embodiment of the present invention is shown in FIG. 10. However, the scope of the present invention is not limited to FIG. 10, and a further step may be provided.

The material of the substrate may be appropriately selected according to the field to which the manufacturing method of the insulated conductive pattern according to the exemplary embodiment of the present invention is applied, and as preferable examples thereof, there are a glass or an inorganic material substrate, a plastic substrate or other flexible substrate, but the material is not limited thereto.

The material of the conductive film is not particularly limited, but it is preferable that the material is a metal film. As a detailed example of the material of the conductive film, a single film or a multilayered film including silver, aluminum, copper, neodymium, molybdenum or an alloy thereof is preferable. Herein, the thickness of the conductive film is not particularly limited, but is preferably 0.01 to 10 μm in terms of the conductivity of the conductive pattern and the economic efficiency of the forming process thereof.

The method for forming the conductive film is not particularly limited, and methods such as deposition, sputtering, wet coating, vaporization, electroplating, electroless plating, and lamination of a metal thin film may be used. According to the exemplary embodiment of the present invention, there are advantages in that a conductive pattern included in an effective screen part of an electronic part for display and a wire part for applying a signal thereto may be simultaneously formed. In particular, as the method for forming the conductive film, a method where after organic metal, nano metal or a complex solution thereof is coated on the substrate, conductivity is provided by sintering and/or drying. As the organic metal, organic silver may be used, and as the nano metal, nano silver particles may be used.

In the exemplary embodiment of the present invention, before the conductive film is formed, a buffer layer for providing adhesion strength may be further formed on the substrate.

The method according to the exemplary embodiment of the present invention may further include a washing step after step a).

In step b), the method for forming the insulation layer pattern is preferably a printing method, a photolithography method, a photography method, a method using a mask, or laser transferring, for example, thermal transfer imaging, and more preferably, a printing method or a photolithography method.

The printing method may be performed in such a method that the paste or ink including the insulation material is transferred on the substrate on which the conductive film is formed in a desired pattern form and then sintered. The transferring method is not particularly limited, but the above pattern is formed on the pattern transferring medium such as an intaglio or screen and the desired pattern may be transferred on the conductive film by using this. The method for forming the pattern form on the pattern transferring medium may be performed by using the method that is known in the art.

The printing method is not particularly limited, and a printing method such as offset printing, reverse offset printing, screen printing, and gravure printing may be used. The offset printing may be performed by using the method in which after the paste is filled in the intaglio on which the pattern is formed, primary transferring is performed by using silicon rubber that is called as the blanket, and the secondary transferring is performed by closely contacting the blanket and the substrate on which the conductive film is formed. The screen printing may be performed by using the method in which after the paste is disposed on the screen on which the pattern is formed, the paste is directly provided on the substrate on which the conductive film is formed through the screen that has the space while the squeeze is pushed. The gravure printing may be performed by using the method in which after the paste is filled in the pattern while the blanket where the pattern is formed is wound on the roll, the paste is transferred on the substrate on which the conductive film is formed. In the exemplary embodiment of the present invention, the above methods may be used alone or in a combination. In addition, other printing methods that are known to those who are skilled in the art may be used.

In the case of the gravure offset printing method or reverse offset printing method, due to the release property of the blanket, since most of the ink or the paste is transferred on the substrate on which the conductive film is formed, a separate blanket washing process is not required. The intaglio may be manufactured by precisely etching the substrate. The intaglio may be manufactured by etching a metal plate, or may be manufactured through optical patterning using a polymer resin.

In the exemplary embodiment of the present invention, it is preferable that the printing method is used, and among them, it is preferable that the offset printing method, reverse offset printing method or gravure printing method is used.

In the case where the reverse offset printing method is used, the viscosity of the ink for printing including the material of the insulation layer is preferably more than 0 cps to 1000 cps or less, and more preferably 5 cps to 10 cps. In addition, in the case where the gravure printing method is used, the viscosity of the ink is preferably 6000 cps to 12000 cps, and more preferably 7000 cps to 8000 cps. When the viscosity of ink is in the above range, coating of ink may be appropriately performed and stability of ink (process maintaining ability of ink) may be maintained during the process, in each printing method.

In the exemplary embodiment of the present invention, the method for forming the insulation layer pattern is not limited to the above printing method, and the photolithography method may be used. For example, a method for forming an insulation layer having the photosensitivity and acid resistance (resistance to etching) on a conductive film and patterning the layer by selective exposure and developing may be used.

After the insulation layer pattern is formed, the taper angle of the insulation layer pattern is preferably more than 0 to less than 90°, and more preferably 10 or more to 70° or less. Herein, the taper angle means an angle between an end of the insulation layer pattern and a lower part layer thereof, that is, the surface of the conductive film. The taper angle may be measured by an angle between a straight line having an average slope of tangent lines from the end point of the insulation layer pattern to the point at which the upper surface of the insulation layer pattern starts to be flat and the surface of the lower part layer thereof.

When the taper angle of the insulation layer pattern is in the above range, in step d), the reforming of the insulation layer pattern easily occurs, and the insulation layer pattern may sufficiently cover the conductive pattern.

It is preferable that the insulation layer is formed by using a material having an insulation property, acid resistance not reacting with the etching solution used when the conductive pattern is formed, and sufficient adhesion strength to the conductive film. In particular, the method of the exemplary embodiment of the present invention includes d) reforming the insulation layer pattern for covering the conductive pattern, and in step d), in the case where the method for reforming the insulation layer pattern by treatment with heat, solvent, fume (fume of the solvent) or plasma is used, as the material of the insulation layer, it is preferable that a polymer material having mobility by the treatment with heat, solvent, fume (fume of the solvent) or plasma and acid resistance is used, and it is more preferable that a polymer material having a crosslinking ability is used.

It is preferable that the material of the insulation layer has an insulation property of a leakage current of $10^{-1}$ ampere or less. The leakage current of the insulation layer may be $10^{-16}$ ampere or more. It is preferable that the material of the insulation layer has acid resistance in respects to the etching solution of the conductive film used in the corresponding method, and for example, it is preferable that there is no shape change for 10 min or more when contacting with the etching solution of the corresponding conductive film by the dipping or spray method. In addition, it is preferable that the material of the insulation layer has mobility in a processing condition for step d) to be described below.

As the material of the insulation layer, it is preferable that the polymer material having the plasticity or curing property is used under the reforming condition of the insulation layer pattern to be described below. In the exemplary embodiment of the present invention, as the insulation layer material, a thermal curable resin and a UV curable resin may be used.

Since the UV curable resin may not use a solvent unlike the thermal curable resin, there is no problem according to vaporization of the solvent, such that the UV curable resin is advantageous in formation of a stable type of fine pattern. In detail, as an example of the material of the insulation layer, imide-based polymer, bisphenol-based polymer, epoxy-based polymer, acryl-based polymer, ester-based polymer, novolac-based polymer; or a combination thereof may be used. Among them, the acryl-based, imide-based, or novolac-based resin is preferable. In addition, as an example of the material of the insulation layer, a combination or copolymer of two or more selected from imide-based monomer, bisphenol-based monomer, epoxy-based monomer, acryl-based monomer, and ester-based monomer, for example, the epoxylated acryl resin or the copolymer of epoxy-based monomer and acryl-based monomer may be used.

In the case where the insulation layer pattern is formed by the printing method, the process margin may be increased by controlling the solid content or appropriately selecting the solvent.

The solid content of the printing composition for forming the insulation layer pattern may be variously controlled according to the kind of the printing method or the thickness of the insulation layer pattern. For example, in the case of using the gravure printing method, it is preferable that the solid content of the insulation layer pattern composition is in the range of 70 wt % to 80 wt %. In addition, in the case of forming the insulation layer pattern having the thickness of 100 nm to 10 micrometer, and more preferably 500 nm to 2 micrometer by using the reverse offset printing method, it is preferable that the solid content of the insulation layer pattern composition is in the range of 10 wt % to 25 wt %. However, the range of the exemplary embodiment of the present invention is not limited to the above examples, and the solid content of the insulation layer pattern composition may be controlled by the person with ordinary skill according to other materials or the process condition.

As the solvent that can be added to the insulation layer pattern composition, a solvent that can be used in the art may be used, a single kind of solvent or a mixed solvent of two or more kinds may be used. For example, the solvent which does not damage a blanket material used in the printing method, for example PDMS, is not particularly limited. For example, PGMEA (propylene glycol methyl ether acetate), ethanol, propylene carbonate, butyl cellosolve, DMAc (dimethyl acetamide), MEK (methyl ethyl ketone), and MIBK (methyl isobutyl ketone) may be used.

The composition for forming the insulation layer pattern may further include an adhesion promoter and a surfactant.

In addition, in order to allow the insulation layer to sufficiently cover the conductive pattern, it is preferable that the thickness of the insulation layer is larger than the thickness of the conductive film, but is not limited thereto. In addition, the width of the insulation layer pattern may be appropriately selected by the person with ordinary skill according to the field to which the method of the exemplary embodiment of the present invention is applied, and is not particularly limited. For example, it is preferable that the width of the lower part of the insulation layer pattern has a dimension so that as to cover all of the upper surface and the lateral surface of the conductive pattern.

In step c), the formation of the conductive pattern may be implemented by performing etching using the insulation layer pattern as a mask.

The above etching manner may be a wet etching using the etching solution or a dry etching using plasma or laser, but is not limited thereto.

In the case where the wet etching is used, as the etching solution, a nitric acid (HNO$_3$) solution, a mixed acid solution of phosphoric acid/nitric acid/acetic acid, one or more aqueous solutions of hydrogen peroxide, a perchloric acid, a hydrochloric acid, a hydrofluoric acid and an oxalic acid may be used. If necessary, an additive and the other elements for etching a desired conductive film may be added. However, the etching solution is not limited thereto, and in general, a matter that is known as the etching solution of the corresponding conductive film may be used.

In step c), when the conductive film is etched, it is preferable that an undercut is formed at an underpart of an edge of the insulation layer pattern by performing overetching.

The term "undercut" means a form where when a first layer is formed on a substrate, a second layer is formed thereon, and then only the first layer is selectively etched by using the second layer as the mask, a lateral surface of the first layer is overetched, such that an area of the first layer is smaller than an area of the second layer. Herein, the wording "using the second layer as a mask" means that the second layer is not modified or removed, but remains by the etching.

In the general etching process, in the case where the first layer is etched by using the second layer as the mask, the process aims to implement the pattern of the first layer having the same shape as the pattern of the second layer, and rejects the occurrence of the undercut.

However, in the exemplary embodiment of the present invention, in the case where the conductive film is etched so that the undercut is formed at the underpart of the insulation layer pattern, in step d), the conductive pattern can be sufficiently covered by the insulation layer pattern, which is preferable. In addition, in the case where the conductive film is etched so that the undercut is formed, since the etching can be sufficiently implemented, foreign materials such as the residual conductive material do not remain on the substrate on which the conductive pattern is not formed, such that there is an advantage in that short-circuit does not occur in the final products.

In the case where the undercut occurs in step c), the width or the length of the insulation layer pattern becomes larger than the width or the length of the conductive pattern, and in this case, it is preferable that a difference between the width or the length of the insulation layer pattern and the width or the length of the conductive pattern is larger than the thickness of the conductive pattern, and is larger than the thickness of the conductive pattern by two times or more. In this case, the edge of the insulation layer pattern may be sunk by the reforming to sufficiently cover the conductive pattern.

In addition, in the case where the undercut occurs, the taper angle of the conductive pattern is preferably more than 0 to less than 90°, more preferably more than 0 to 45° or more, and more preferably more than 0 to 30° or less. Herein, the taper angle means an angle between an end of the conductive pattern and a lower part layer thereof, that is, the surface of the substrate. The taper angle may be measured by an angle between a straight line having an average slope of tangent lines from the end point of the conductive pattern to the point at which the upper surface of the conductive pattern starts to be flat and the surface of the lower part layer thereof. In the case where the taper angle of the conductive pattern is in the above range, the edge of the insulation layer pattern can be reformed to sufficiently cover the conductive pattern. In the exemplary embodiment of the present invention, it is possible to provide a laminate including a conductive pattern where a taper angle is small unlike a known technology by using the above method.

Figure 8:
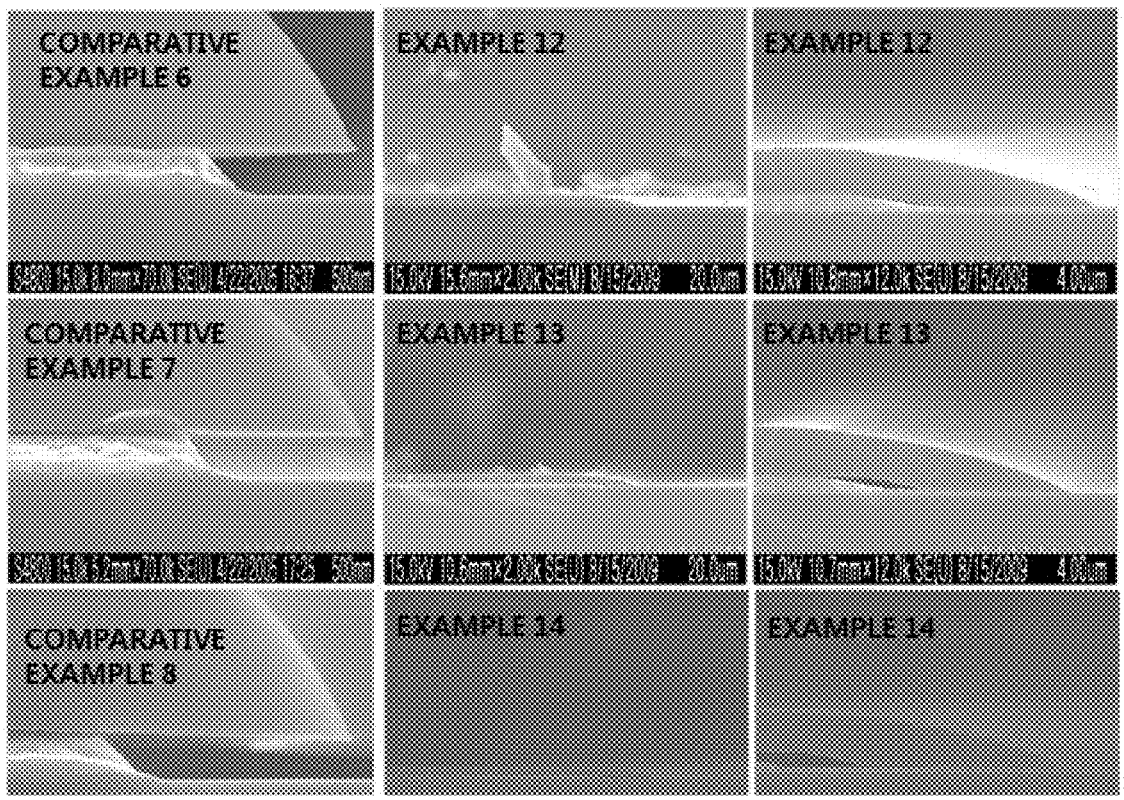
FIG. 8 is a picture illustrating a difference between thicknesses of voids according to an etching time of a conductive film.

In step c), the thickness of the void formed between the conductive pattern and the insulation layer pattern covering the conductive pattern may be controlled according to the etching time for forming the conductive pattern (FIG. 8). As the etching time is increased, when the insulation layer pattern is reformed in step d), the thickness of the void formed between the insulation layer pattern and the conductive pattern may be increased. In the case where the void is too thick, secondary etching for removing foreign materials or deformation of the insulation layer pattern around the void during the washing may occur.

In the exemplary embodiment of the present invention, the etching time for forming the conductive pattern may be changed according to conditions such as the kind or concentration of the etching solution used when the conductive pattern is formed, the kind of the conductive film, and an etching temperature. For example, it is preferable that the etching time is a just-etching time to a time that is delayed by 2000% as compared to the just-etching time, preferably a time that is delayed by 1 to 1000% as compared to the just-etching time, more preferably a time that is delayed by 1 to 500% as compared to the just-etching time, and even more preferably a time that is delayed by 5 to 100% as compared to the just-etching time. Herein, the just-etching time means a time required to etch the pattern to have the same shape as the mask.

The etching temperature for forming the conductive pattern may be changed according to conditions such as the kind or concentration of the etching solution used when the conductive pattern is formed, the kind of the conductive film, and the etching temperature, and for example, the etching may be performed at normal temperature to 80° C., and preferably 30 to 70° C.

As the etching method, a dip etching method or a spray method may be feasible, and the spray method is more preferable for uniform etching.

In the case where the conductive film is a multilayered film, it is preferable that the etching solution is used so that the multilayered films are simultaneously etched at almost the same rate.

In the exemplary embodiment of the present invention, the term "covering" means that the shape of the insulation layer pattern reflows while being changed, and is tightly contacted with the lateral surface of the conductive pattern and the substrate to insulate the conductive pattern from the outside. In addition, in the exemplary embodiment of the present invention, the term "reforming" is a term defined in the present specification, and means that the shape of the insulation layer pattern is changed with mobility to cover the conductive pattern at the lower part thereof.

In step d), the reforming may use a chemical phenomenon that the insulation layer pattern is cured by providing mobility to the insulation layer pattern by, for example, heat, solvent or fume thereof (fume of the solvent), or plasma treatment to cause deformation, and additional heat or plasma treatment or removal of the solvent. In addition, the reforming may be physically deformed by applying a pressure to the insulation layer pattern.

It is more preferable that the reforming of the insulation layer pattern uses heat or the solvent (or the fume of the solvent), and in this case, as described above, it is preferable that a plastic or curable polymer material is used as the material of the insulation layer.

In the case where the insulation layer pattern is reformed by using heat, a method where after the material of the insulation layer has mobility by applying heat, and sunk in a space between the substrate and the insulation layer, the material is cured by applying more heat to remove mobility is preferable. In this case, the heating temperature may be appropriately selected by the person with ordinary skill according to the material of the insulation layer. It is preferable that the heating condition is controlled so that the insulation layer pattern has a desired degree of crosslinking, for example, 10% to 100% and a desired insulation property, for example, a leakage current of $10^{-1}$ ampere or less. For example, it is preferable that the temperature is increased at 5 to 60° C./min by heating at a temperature of 120 to 350° C. In addition, it is possible to perform heat treatment at the same temperature or overlapping heat treatment at different temperatures. As a detailed example thereof, in the case where an imide-based resin is used as the insulation layer pattern material, heat treatment may be performed at a temperature of 250 to 300° C. As another detailed example thereof, in the case where a novolac-based resin is used as the insulation layer pattern material, heat treatment may be performed at a temperature of 120 to 140° C.

In addition, in the case where the insulation layer pattern is reformed by using the solvent or the fume of the solvent, a reforming method in which if the solvent and the material of the insulation layer are reacted with each other by exposing the insulation layer pattern to a fume atmosphere of the solvent (solvent annealing), the material of the insulation layer shows mobility to deform the insulation layer pattern, thereby being contacted with the substrate, and if the solvent is removed by heating the solvent to a predetermined temperature at which the solvent is dried, the material of the insulation layer is cured, such that the mobility is removed is preferable. In this case, the solvent may be appropriately selected by the person with ordinary skill according to the material of the insulation layer, and it is preferable that the solvent is selected from the group of solvents in which the material of the insulation layer can be dissolved. For example, in the case where the novolac resin is used as the material of the insulation layer, IPA may be used as the solvent. In addition, the dry temperature is appropriately around a boiling point of the selected solvent, and it is preferable that the dry temperature is normal temperature to 300° C., but the temperature is not limited thereto.

In the exemplary embodiment of the present invention, it is preferable that a soft bake process is performed during or after step b) for forming the insulation layer pattern. In detail, it is preferable that the soft bake process is performed after the insulation layer is formed on the substrate and after the insulation layer pattern is formed during step b), or before the conductive pattern is formed during step c). The soft bake means that adhesion strength between the insulation layer pattern and the layer adjacent thereto is provided, deformation of the insulation layer pattern is prevented during the soft bake step or the subsequent step by curing at least a portion of the insulation layer pattern, and the form where the insulation layer pattern reflows during the reforming step of the insulation layer pattern subsequently performed is stably ensured. The degree of curing of the insulation layer pattern to be accomplished by the soft bake process may be determined by the person with ordinary skill according to the material of the insulation layer pattern or the condition of the subsequently performed reforming, and for example, may be in the range of 0 to 100%.

The condition of the soft bake process may be selected by the person with ordinary skill according to the material of the insulation layer pattern, the thickness of the insulation layer pattern, the etching condition used when the conductive pattern is formed, for example, the kind of etching solution, the etching time, and the etching temperature. If the soft bake temperature is too high, the degree of crosslinking of the insulation layer pattern is too high, such that deformation, for example, static cling deformation may occur. For example, in 112 to 130° C. of FIG. 6, from the result of the soft bake, the above deformation can be observed.

As an example thereof, it is preferable that in the case where the insulation layer pattern is formed by using the novolac-based polymer by the photolithography method, the soft bake is performed at 105 to 110° C. for 2 min to 3 min. As another example thereof, it is preferable that in the case where the insulation layer pattern is formed by using the novolac-based polymer by the printing method, the soft bake is performed at 80 to 85° C. for 2 min to 3 min. As still another example thereof, it is preferable that in the case where the insulation layer pattern is formed by using the acryl-based polymer, the soft bake is performed at 170 to 190° C. for 5 min to 15 min. As yet another example thereof, it is preferable that in the case where the insulation layer pattern is formed by using the PSPI polymer, the soft bake is performed at 110 to 150° C. for 1 min to 15 min.

In the case where the soft bake temperature is too low, it is difficult to obtain an effect according to performing of the soft bake, and in the case where the soft bake temperature is too high, the edge of the insulation layer pattern is deformed in a static cling form, which may negatively affect the reforming performed so that the insulation layer pattern covers the conductive pattern. The soft bake time varies according to the above-mentioned material or the process condition, and for example, the soft bake may be performed for 2 to 3 min, but the time is not limited thereto.

The method according to the exemplary embodiment of the present invention method may further include a washing step after the reforming of the insulation layer pattern in step d). In this washing step, the etching solution used in step c) may be used. Foreign material may be removed by performing the washing step.

Figure 1:
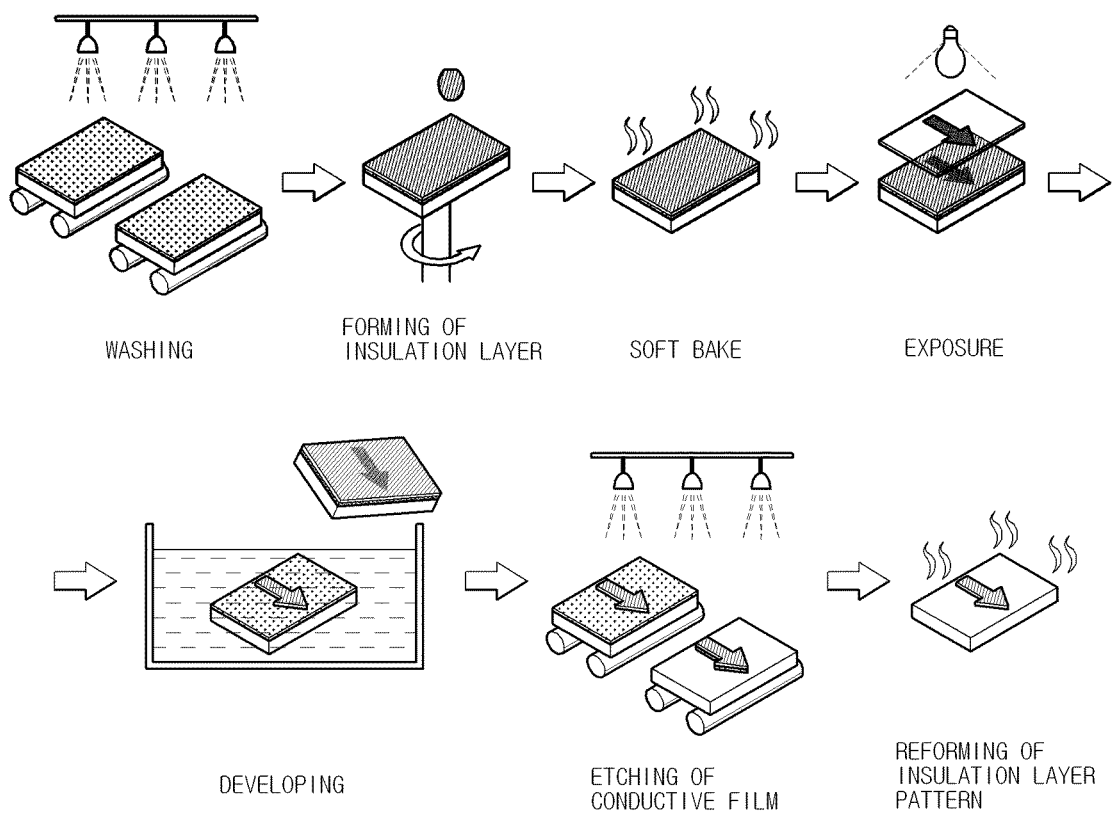
FIG. 1 is a mimetic diagram illustrating a method according to an exemplary embodiment of the present invention.
Figure 2:
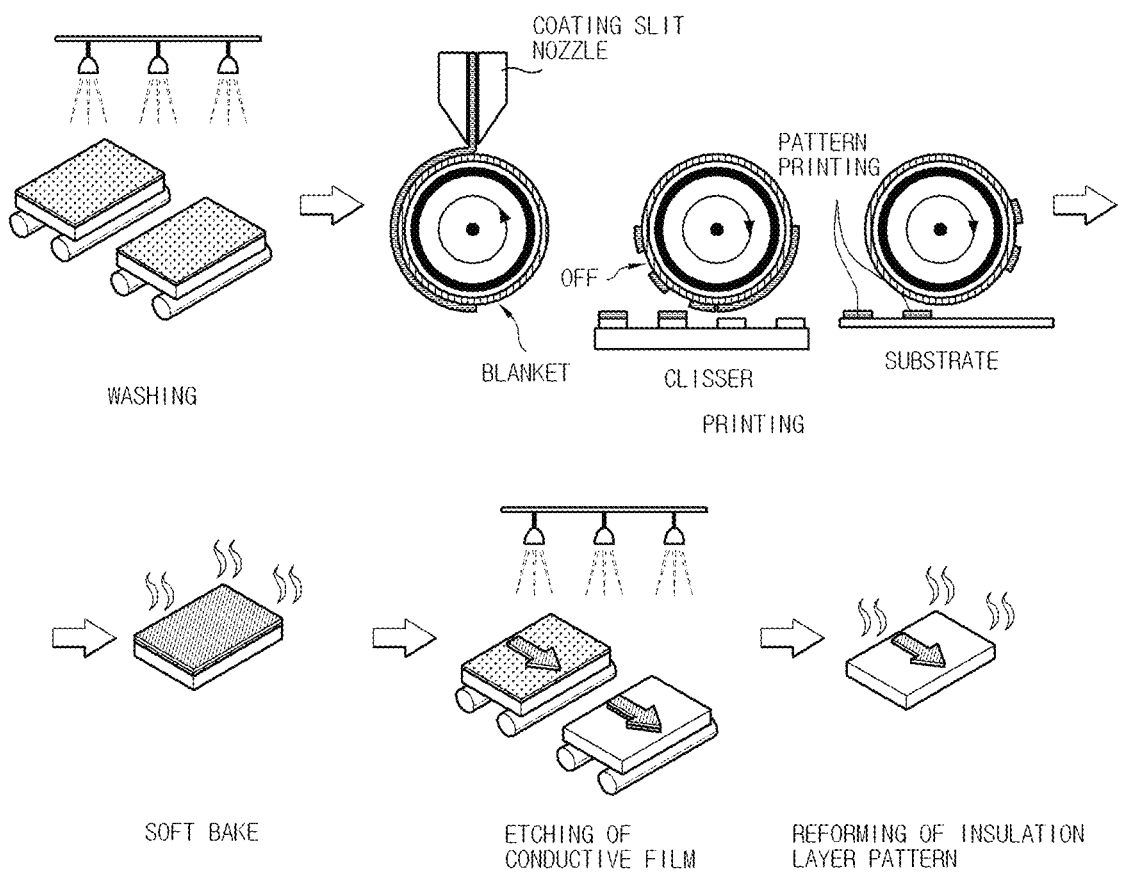
FIG. 2 is a mimetic diagram illustrating a method according to another exemplary embodiment of the present invention.

The mimetic diagram of the method according to the exemplary embodiment of the present invention is shown in FIGS. 1 and 2. However, the scope of the exemplary embodiment of the present invention is not limited by the drawings, and if necessary, processes with the exception of at least one of processes shown in FIG. 1 or 2 may be performed, and if necessary, an additional process may be performed.

FIG. 1 illustrates an example of use of a photolithography method when the insulation layer pattern is formed in the method according to the exemplary embodiment of the present invention. According to FIG. 1, the substrate that is provided with the conductive film is washed, the soft bake process is performed after the insulation layer is formed on the conductive film, the insulation layer pattern is formed by the selective exposure and developing, the conductive pattern is formed by etching the conductive film by using the insulation layer pattern as the mask, and the reforming process of the insulation layer pattern is performed.

FIG. 2 illustrates an example of use of a reverse offset printing method when the insulation layer pattern is formed in the method according to the exemplary embodiment of the present invention. According to FIG. 2, the substrate that is provided with the conductive film is washed, the soft bake process is performed after the insulation layer pattern is printed on the conductive film, the conductive pattern is formed by etching the conductive film by using the insulation layer pattern as the mask, and the reforming process of the insulation layer pattern is performed. In particular, in the case where the process shown in FIG. 2 is used, the number of processes may be largely reduced as compared to a known technology separately using a photoresist for forming the conductive pattern and an insulation material for insulating the conductive pattern.

The conductive pattern in the laminate according to the exemplary embodiment of the present invention method is characterized in having a low taper angle, and the taper angle is less than 90°, preferably 45° or less, and more preferably 30° or less. The insulation layer pattern formed according to the method according to the exemplary embodiment of the present invention may include a region that has a different degree of curing from the other region according to the material of the insulation layer pattern. The region that has a different degree of curing from the other region may be formed at an interface between a region where the insulation layer pattern is not reformed and a region where the insulation layer pattern is reformed, and may be formed in a band shape at the interface. The band may have an upward projection shape as compared to a residual portion in the cross-section thereof. The band shape may be observed in the result of Example 11 in FIG. 7.

In the exemplary embodiment of the present invention, the distance between an end point of the conductive pattern and an end point of the insulation layer pattern may be controlled to 0 to 1 micrometer or 5 micrometer or more by reforming the insulation layer pattern. In particular, in the case where a thermosetting resin is used as the material of the insulation layer pattern, the distance between an end point of the conductive pattern and an end point of the insulation layer pattern may be 0 to 1 micrometer, which is very short. Meanwhile, in the case where a thermoplastic resin is used as the material of the insulation layer pattern, the distance between an end point of the conductive pattern and an end point of the insulation layer pattern may be 5 micrometer or more, which is relatively long.

In the exemplary embodiment of the present invention, since the reforming of the insulation layer pattern is performed, a void between the conductive pattern and the insulation layer pattern may be observed. This is different from the case where a void is not observed in the case where an insulation layer is formed on a conductive pattern in the related art. In the exemplary embodiment of the present invention, the thickness of the void (shortest distance between the longest side and the shortest side) is preferably more than 0 to the thickness of the conductive pattern or less, and more preferably more than 0 to 0.7 or less of the thickness of the conductive pattern.

In the laminate according to the exemplary embodiment of the present invention, the taper angle of the insulation layer pattern may be larger than the taper angle of the conductive pattern.

In the laminate manufactured by the method according to the exemplary embodiment of the present invention, the shape of the cross-section of the reformed insulation layer pattern may be, for example, a semisphere.

In the laminate manufactured by using the method according to the exemplary embodiment of the present invention, the line width of the conductive pattern is not particularly limited, but the conductive pattern may have the fine line width of 100 micrometers or less, preferably 0.1 to 30 micrometers, more preferably 0.5 to 10 micrometers, and more preferably 1 to 5 micrometers. In particular, in the above method, when the conductive film is etched by using the insulation layer pattern as the mask, a more fine line width may be implemented by forming an undercut by performing overetching.

Figure 11:
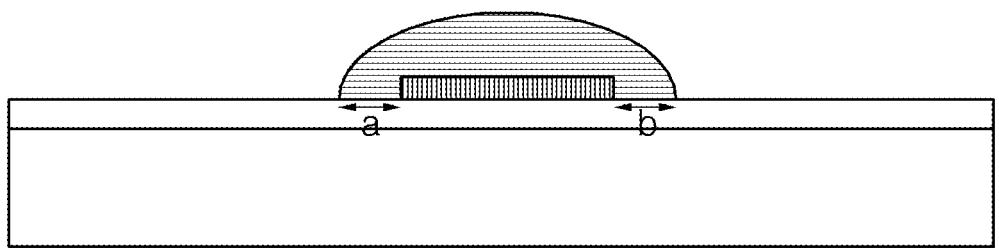
FIGS. 11 and 12 illustrate a structure where an insulation layer pattern is symmetrically laminated on a conductive pattern in the laminate according to an exemplary embodiment of the present invention.
Figure 12:
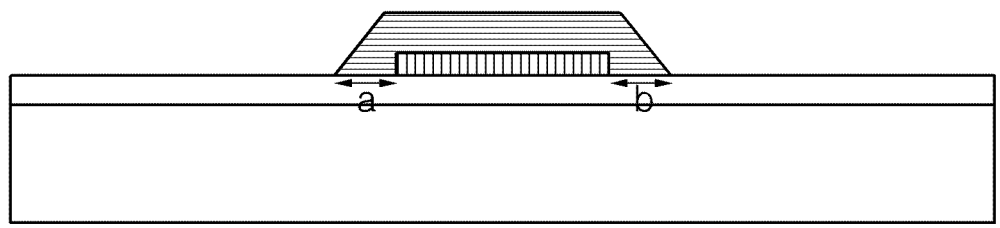

A laminate according to still yet another exemplary embodiment of the present invention includes a substrate, a conductive pattern formed on the substrate, an insulation layer pattern covering the conductive pattern, wherein in a cross-section of a line width direction of the conductive pattern, a percentage ratio of a distance a from a side end of the conductive pattern to an end of the insulation layer pattern and a distance b from the other side end of the conductive pattern to an end of the insulation layer pattern is in the range of 90 to 110. The percentage ratio is preferably 95 to 105, and more preferably 99 to 101. In the method according to the exemplary embodiment of the present invention, the insulation layer pattern and the conductive pattern are formed by using a separate mask, or not formed by using a separate printing method, but after the conductive pattern is formed by using the insulation layer pattern, the insulation layer pattern is used by being reformed, such that the insulation layer pattern disposed on the conductive pattern may be exist in a symmetric structure in respects to the conductive pattern. The symmetric structure is shown in FIGS. 11 and 12, but the scope of the present invention is not limited to the above structure.

Figure 3:
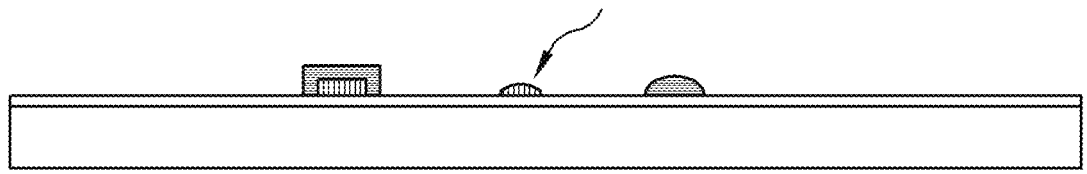
FIG. 3 is a view illustrating an effect that can remove a cause of the occurrence of short-circuit in the case of using the method according to the exemplary embodiment of the present invention.
Figure 3:
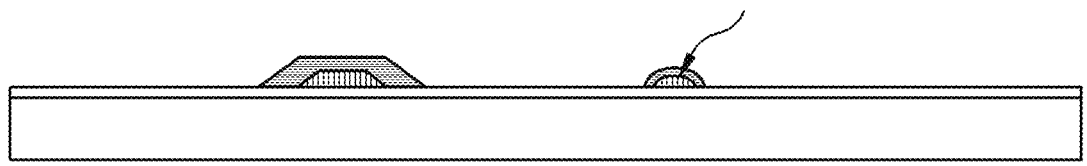

According to the method of the exemplary embodiment of the present invention, when the insulation layer pattern or the conductive pattern is formed during the manufacturing process, it is possible to provide the insulated conductive pattern where a short-circuit does not occur even if the pattern defects occur. Herein, the pattern defects mean the case where the insulation layer pattern for forming the conductive pattern is formed at a portion except for the pattern shape. In detail, in the exemplary embodiment of the present invention, the insulation layer pattern used when the conductive pattern is formed is not removed, but the insulation layer pattern form is reformed, so that the reformed conductive pattern is insulated. Therefore, the conductive pattern that is not insulated by the insulation layer pattern does not exist. Accordingly, when the insulation layer pattern or the conductive pattern is formed, even though the pattern defects occur, foreign materials such as conductive materials do not remain on the substrate, such that a short-circuit does not occur. In the related art, in the case where the conductive patterns are not covered due to pattern defects of the insulation layer pattern, or there is a conductive pattern that is not covered by the insulation layer pattern due to pattern defects of the conductive pattern, a short-circuit may occur. On the other hand, in the exemplary embodiment of the present invention, a defect ratio may be largely reduced because of the above-mentioned reason, and it is unnecessary to introduce an additional washing or an etching process for removing a conductive pattern defect region required in the related art. The effect of the exemplary embodiment of the present invention is shown in FIG. 3. Therefore, according to the method of the exemplary embodiment of the present invention, it is possible to provide an insulated conductive pattern where a short-circuit due to pattern defects does not substantially occur.

The insulated conductive pattern manufactured by the method according to the exemplary embodiment of the present invention or the laminate may be used without a limit if the insulated conductive pattern or the laminate is used for purpose of the insulated conductive pattern. For example, the insulated conductive pattern or the laminate may be used as an electrode of an electronic element or lighting, but is not limited thereto. Examples of the electronic element include a touch screen, a display, and a semiconductor.

Hereinafter, the present invention will be exemplified through Examples. However, the following Examples are set forth to illustrate the present invention, but the scope of the present invention is not limited thereto.

EXAMPLES

Example 1

The chrome layer having the thickness of 300 nm was formed as the conductive film on the glass substrate by the deposition method. Subsequently, the insulation layer pattern having the width of 60 micrometers and the pitch of 5 mm was formed by adding the novolac resin composition (trade mark: LG412DF, manufactured by LG Chem, Ltd., in Korea) on the chrome layer by using the photolithography method. The soft bake was performed in respects to the insulation layer by maintaining the temperature at 107° C. during the process for forming the insulation layer pattern by using the photolithography method.

The chrome layer was patterned by using the insulation layer pattern as the mask. In this case, trade mark CE-05E manufactured by EXAX, Co., Ltd., in Korea was used as the etching solution. The width of the upper part of the chrome layer pattern manufactured by the method was 57 micrometers and the taper angle was 18°.

Figure 4:
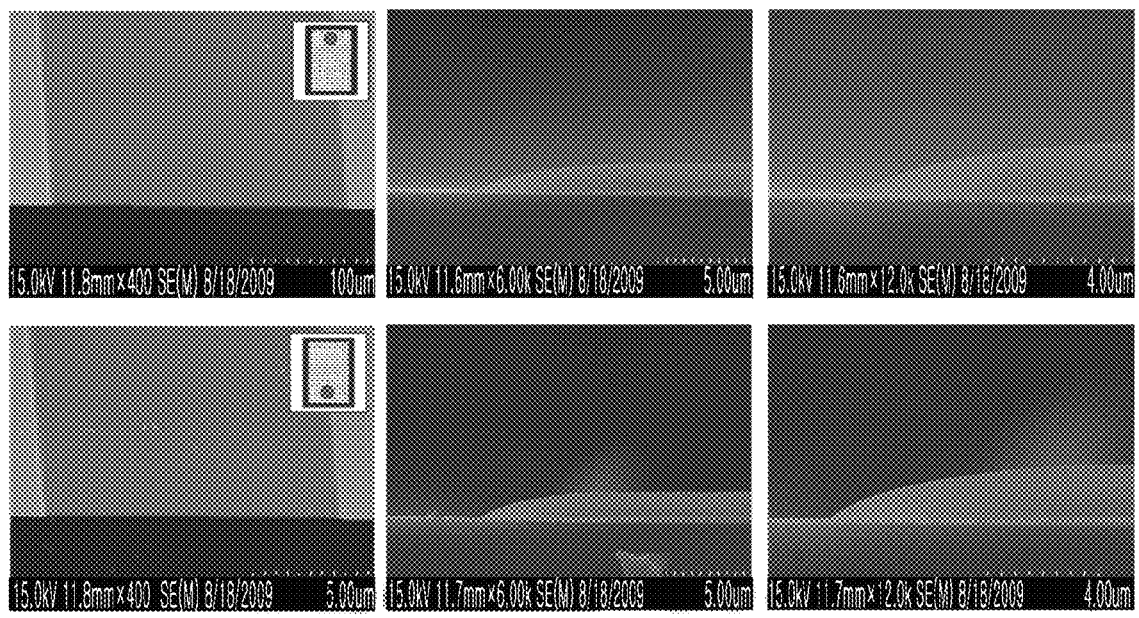
FIG. 4 is an electronic microscopic picture of a cross-section of a laminate manufactured in Example 1.

The substrate including the insulation layer pattern and the chrome layer pattern manufactured as described above was put on the hot plate, and the reflow process was performed at 130° C. for 3 min. The electronic microscopic pictures of the upper surface and the lateral surface of the resultant material formed by this are shown in FIG. 4.

Example 2

Figure 5:
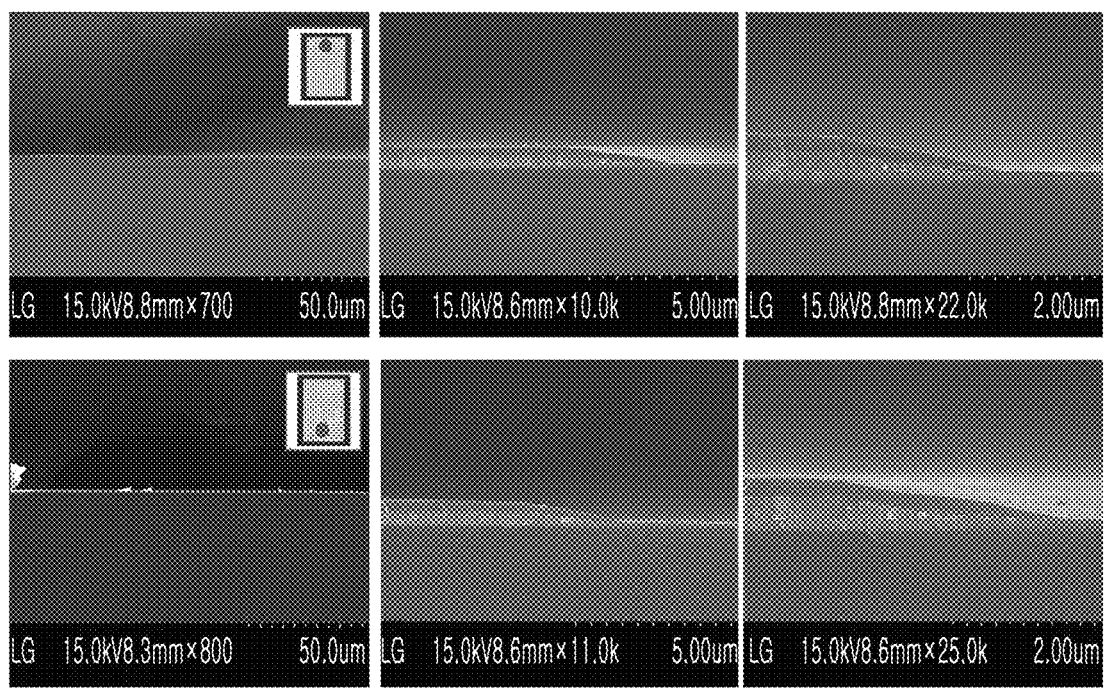
FIG. 5 is an electronic microscopic picture of a cross-section of a laminate manufactured in Example 2.

The same method as Example 1 was performed, except that LG412DF to which the surfactant was added and the PGMEA/EtOH mixed solvent (mixing weight ratio 7:3) were mixed in the solid content of 13 wt % and used as the material of the insulation layer pattern, and the reverse offset printing method was used instead of the photolithography method as the method for forming the insulation layer pattern. The electronic microscopic pictures of the upper surface and the lateral surface of the resultant material formed by this are shown in FIG. 5.

Example 3

The same method as Example 1 was performed, except that silver was used instead of chrome as the material of the conductive film. The reflow shape as shown in FIG. 4 and measured in Example 1 could be obtained.

Examples 4 to 9

Figure 6:
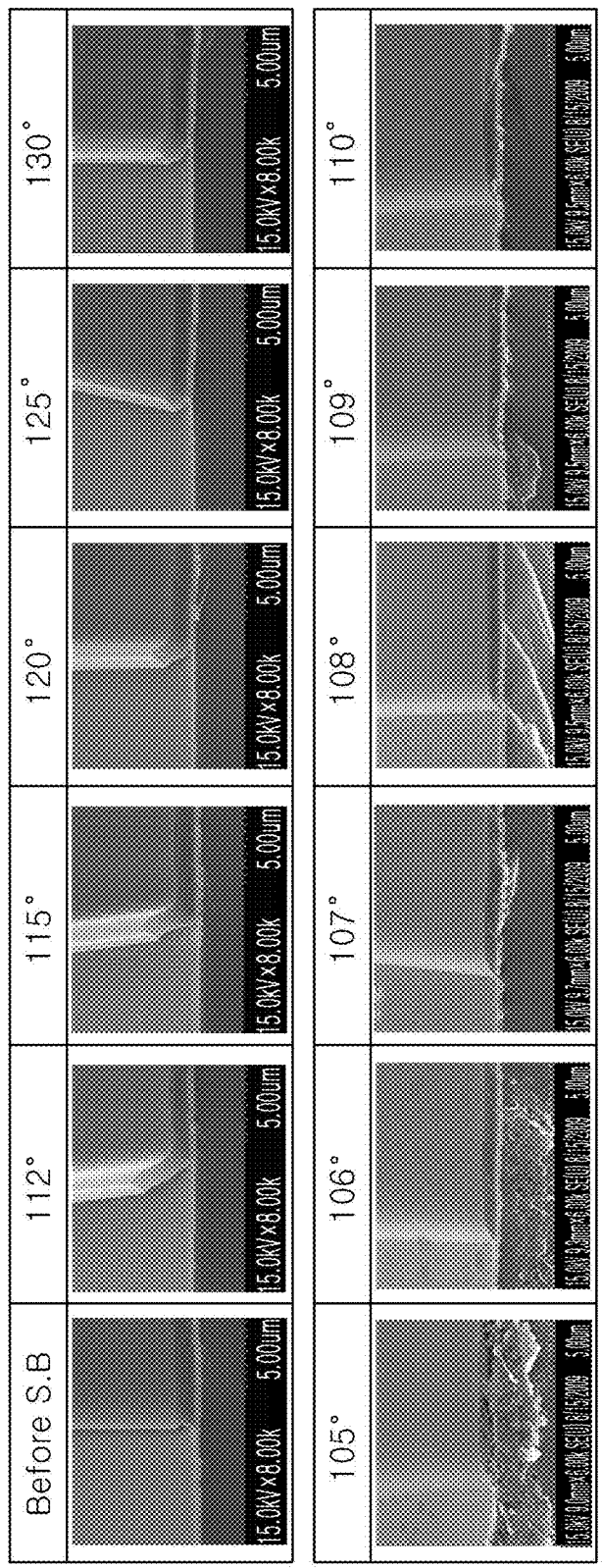
FIG. 6 is a picture illustrating reflow of an insulation layer pattern according to a soft bake temperature.

The same method as Example 1 was performed, except that the soft bake was performed for 2 min and 30 sec while the soft bake temperature was maintained at 105° C. (Example 4), 106° C. (Example 5), 107° C. (Example 6), 108° C. (Example 7), 109° C. (Example 8), and 110° C. (Example 9), respectively. The electronic microscopic picture of the shape of the reformed insulation layer pattern is shown in FIG. 6.

Comparative Examples 1 to 5

The same method as Example 1 was performed, except that after the insulation layer was patterned, the soft bake was performed for 2 min and 30 sec while the soft bake temperature was maintained at 112° C. (Comparative Example 1), 115° C. (Comparative Example 2), 120° C. (Comparative Example 3), 125° C. (Comparative Example 4), and 130° C. (Comparative Example 5), respectively. The picture of the shape of the reformed insulation layer pattern is shown in FIG. 6.

Examples 10 and 11

Figure 7:
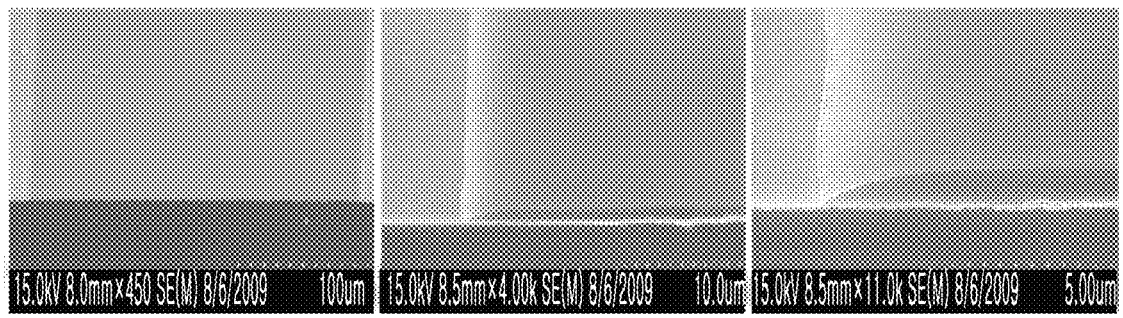
FIG. 7 is an electronic microscopic picture of a cross-section of a laminate manufactured in Examples 1, 10, and 11.
Figure 7:
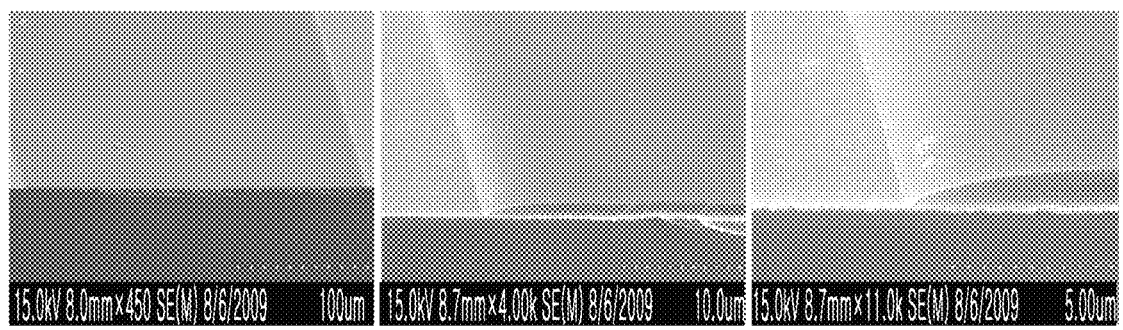
Figure 7:
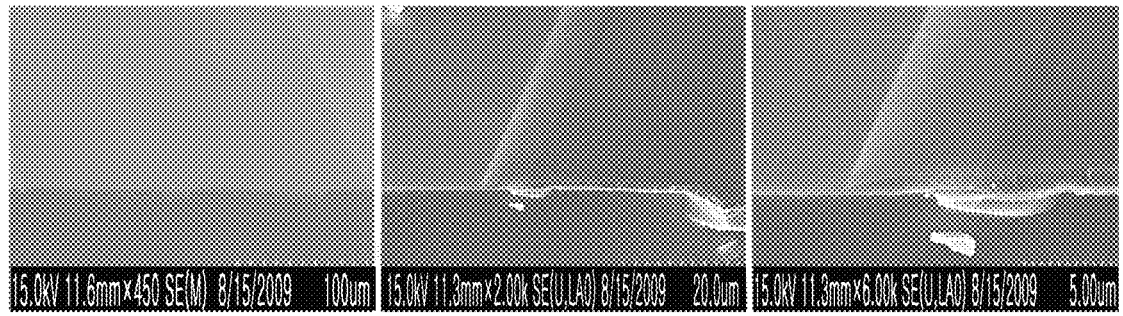

The same method as Example 1 was performed, except that as the material of the insulation layer pattern, the acryl-based resin (acrylate epoxy resin where carbon black was dispersed, Example 10), and the polyimide-based resin (trade mark: EL 200 manufactured by LG Chem, Ltd., Example 11) were used, respectively. The electronic microscopic pictures of the upper surface and the lateral surface of the resultant material formed by Examples 1, 10, and 11 are shown in FIG. 7. As shown in FIG. 7, there was no large difference in reflow formation for each Example and each position in the manufactured conductive pattern.

Examples 12 to 14

The same method as Example 1 was performed, except that when the conductive film was etched, the CE-05E HNO3-based etching solution manufactured by EXAX Co., Ltd., in Korea was used as the etching solution, and the etching time was 10% delay time (Example 12), 20% delay time (Example 13), and 30% delay time (Example 14) of the just-etching time (3 min), respectively. The picture of the lateral surface of the conductive pattern manufactured in Example 12 to Example 14 is shown in FIG. 8. It can be seen that the thickness and the length of the void between the conductive pattern and the insulation layer pattern are increased as the etching time is increased.

Comparative Examples 6 to 8

The same method as Example 1 was performed, except that the etching time was 10% delay time (Comparative Example 6), 20% delay time (Comparative Example 7), and 30% delay time (Comparative Example 8) of the just-etching time (3 min) without performing the reflow step. The pictures of the lateral surface of the conductive pattern manufactured in Comparative Examples 6 to 8 are shown in FIG. 8.

Example 15

The same method as Example 2 was performed, except that the solid content of the insulation layer material was 15 wt %.

Example 16

The same method as Example 2 was performed, except that MEK was used instead of EtOH as the solvent of the insulation layer material, and the solid content was 15 wt %.

The process margins of Examples 2, 15, and 16 are described in the following Table 1. Here, the process margin means a time for forming the pattern on the coating roll after the insulation layer material is coated on the coating roll.

TABLE 1

|  | Example 2 | Example 15 | Example 16 |
| --- | --- | --- | --- |
| Solid content | 13% | 15% | 15% |
| Solvent | PGMEA/EtOH | PGMEA/EtOH | PGMEA/MEK |
| Average transfer ratio | 70 | 100 | 100 |
| Process margin (s) | 0 < M < 10 | 0 < M < 20 | 0 < M < 3 |

Example 17

Figure 9:
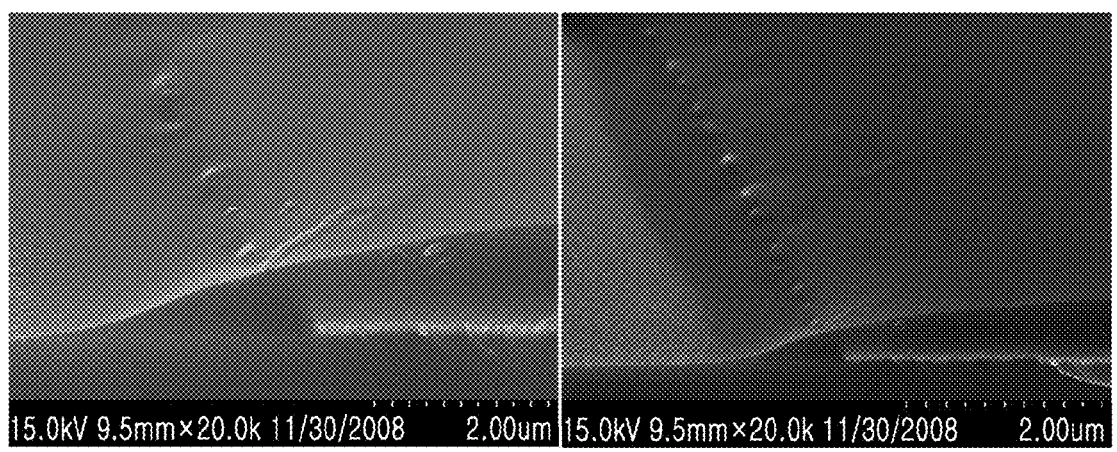
FIG. 9 is an electronic microscopic picture of a cross-section of a laminate manufactured in Example 17.

The same method as Example 1 was performed, except that the solvent annealing was performed by exposing in the fume atmosphere of IPA (isopropyl alcohol) instead of the heat treatment at 130° C. for 3 min as the reflow condition. The electronic microscopic pictures of the upper surface and the lateral surface of the resultant material formed by this are shown in FIG. 9.

The invention claimed is:

1. A method for manufacturing an insulated conductive pattern, the method comprising:
   a) forming a conductive film on a substrate;
   b) forming an insulation layer pattern on the conductive film;
   c) forming a conductive pattern by etching the conductive film by using the insulation layer pattern as a mask; and
   d) reforming the insulation layer pattern for covering the conductive pattern,
   wherein in step c), a taper angle of the conductive pattern is more than 0° to less than 90°,
   wherein a taper angle of the insulation layer pattern is more than 0° to less than 90°,
   wherein the insulation layer pattern is not removed so that the conductive pattern is insulated,
   wherein in step c), an etching time of the conductive film is a just-etching time to a time that is delayed by 2000% as compared to the just-etching time,
   wherein a line width of the conductive pattern is 100 micrometers or less, and
   wherein the insulation layer pattern includes one or more polymer selected from imide-based polymer, bisphenol-based polymer, epoxy-based polymer, acryl-based polymer, ester-based polymer, and novolac-based polymer; or a combination or copolymer of two or more selected from imide-based monomer, bisphenol-based monomer, epoxy-based monomer, acryl-based monomer, and ester-based monomer.

2. The method of claim 1, wherein in step b), the forming of the insulation layer pattern is a method selected from a printing method, a photolithography method, a photography method, a method using a mask, and laser transferring.

3. The method of claim 2, wherein the printing method is offset printing, reverse offset printing, screen printing or gravure printing.

4. The method of claim 1, wherein in step c), after the etching of the conductive film, an undercut is formed in an underpart of an edge of the insulation layer pattern.

5. The method of claim 1, wherein the conductive film is a single film or a multilayered film including metal.

6. The method of claim 1, wherein the insulation layer pattern includes one or more polymer selected from imide-based polymer, bisphenol-based polymer, epoxy-based polymer, acryl-based polymer, ester-based polymer, and novolac-based polymer; or a combination or copolymer of two or more selected from imide-based monomer, bisphenol-based monomer, epoxy-based monomer, acryl-based monomer, and ester-based monomer.

7. The method of claim 1, wherein in step d), the thickness of the insulation layer pattern is larger than the thickness of the conductive pattern.

8. The method of claim 1, wherein in step d), the reforming method of the insulation layer pattern includes heat treatment, a contact with a solvent or a fume of the solvent, plasma treatment, or pressurizing.

9. The method of claim 1, further comprising a soft baking step during or after step b).

10. A laminate comprising:
    a substrate;
    a conductive pattern formed on the substrate; and
    an insulation layer pattern covering the conductive pattern,
    wherein the laminate is manufactured by a method comprising:
    a) forming a conductive film on a substrate;
    b) forming an insulation layer pattern on the conductive film;
    c) forming a conductive pattern by etching the conductive film by using the insulation layer pattern as a mask; and
    d) reforming the insulation layer pattern for covering the conductive pattern, and
    wherein a taper angle of the insulation layer pattern is larger than a taper angle of the conductive pattern,
    wherein in step c), an etching time of the conductive film is a just-etching time to a time that is delayed by 2000% as compared to the just-etching time,
    wherein a line width of the conductive pattern is 100 micrometers or less, and
    wherein the insulation layer pattern includes one or more polymer selected from imide-based polymer, bisphenol-based polymer, epoxy-based polymer, acryl-based polymer, ester-based polymer, and novolac-based polymer; or a combination or copolymer of two or more selected from imide-based monomer, bisphenol-based monomer, epoxy-based monomer, acryl-based monomer, and ester-based monomer.

11. A laminate comprising:
    a substrate;
    a conductive pattern formed on the substrate; and
    an insulation layer pattern covering the conductive pattern,
    wherein the laminate is manufactured by a method comprising:
    a) forming a conductive film on a substrate;
    b) forming an insulation layer pattern on the conductive film;
    c) forming a conductive pattern by etching the conductive film by using the insulation layer pattern as a mask; and
    d) reforming the insulation layer pattern for covering the conductive pattern, and
    wherein in a cross-section of a line width direction of the conductive pattern, a percentage ratio (a/b*100) of a distance a from one side end of the conductive pattern to an end of the insulation layer pattern and a distance b from the other side end of the conductive pattern to an end of the insulation layer pattern is in the range of 90 to 110,
    wherein in step c), an etching time of the conductive film is a just-etching time to a time that is delayed by 2000% as compared to the just-etching time,
    wherein a line width of the conductive pattern is 100 micrometers or less, and
    wherein the insulation layer pattern includes one or more polymer selected from imide-based polymer, bisphenol-based polymer, epoxy-based polymer, acryl-based polymer, ester-based polymer, and novolac-based polymer; or a combination or copolymer of two or more selected from imide-based monomer, bisphenol-based monomer, epoxy-based monomer, acryl-based monomer, and ester-based monomer.

* * * * *